US011406187B2

(12) United States Patent
Chen et al.

(10) Patent No.: US 11,406,187 B2
(45) Date of Patent: Aug. 9, 2022

(54) SLIDE RAIL ASSEMBLY

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Tzu-Cheng Weng, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 17/207,758

(22) Filed: Mar. 22, 2021

(65) Prior Publication Data

US 2022/0202181 A1 Jun. 30, 2022

(30) Foreign Application Priority Data

Dec. 30, 2020 (TW) .................................. 109147232

(51) Int. Cl.
*A47B 88/477* (2017.01)
*A47B 88/447* (2017.01)
*A47B 88/49* (2017.01)

(52) U.S. Cl.
CPC .......... *A47B 88/477* (2017.01); *A47B 88/447* (2017.01); *A47B 88/49* (2017.01); *A47B 2210/007* (2013.01); *A47B 2210/0081* (2013.01)

(58) Field of Classification Search
CPC ..... A47B 88/477; A47B 88/447; A47B 88/49; A47B 2210/007; A47B 2210/0081
See application file for complete search history.

(56) References Cited

U.S. PATENT DOCUMENTS

| 6,402,275 | B1 | 6/2002 | Yang |
| 6,899,408 | B2 | 5/2005 | Chen |

(Continued)

FOREIGN PATENT DOCUMENTS

| JP | 3088768 U | 9/2002 |
| JP | 3097862 U | 2/2004 |

(Continued)

*Primary Examiner* — Hanh V Tran
(74) *Attorney, Agent, or Firm* — Winston Hsu

(57) ABSTRACT

A slide rail assembly includes a first rail including a blocking member and a positioning member, a second rail including a predetermined feature, a working member and an operation member. When the second rail is at a first extending position, the blocking member is in a blocking state capable of blocking the working member so as to prevent the second rail from displacing along a retracting direction. The operation member is capable of being operated to drive the blocking member to leave the blocking state so as to allow the second rail to displace along the retracting direction. When the second rail is displaced from the first extending position to a second extending position along the retracting direction, the second rail is engaged with the positioning member through the predetermined feature so as to prevent the second rail from leaving the second extending position.

20 Claims, 14 Drawing Sheets

(56) References Cited

U.S. PATENT DOCUMENTS

| | | | | |
|---|---|---|---|---|
| 7,404,611 B1* | 7/2008 | Que | ............... | A47B 88/493 |
| | | | | 312/334.46 |
| 8,585,164 B2* | 11/2013 | Chen | ............... | A47B 88/49 |
| | | | | 312/334.46 |
| 8,733,864 B2 | 5/2014 | Chen | | |
| 9,681,749 B2* | 6/2017 | Chen | ............... | A47B 96/061 |
| 9,709,091 B2* | 7/2017 | Chen | ............... | F16C 29/12 |
| 9,992,906 B2* | 6/2018 | Chen | ............... | A47B 88/49 |
| 10,041,535 B2* | 8/2018 | Chen | ............... | A47B 88/57 |
| 10,334,950 B2* | 7/2019 | Chen | ............... | A47B 88/443 |
| 10,342,341 B2* | 7/2019 | Chen | ............... | A47B 88/57 |
| 10,413,065 B2 | 9/2019 | Chen | | |
| 10,477,965 B1* | 11/2019 | Chen | ............... | A47B 88/43 |
| 10,499,738 B2 | 12/2019 | Chen | | |
| 10,568,426 B1* | 2/2020 | Chen | ............... | H05K 7/1489 |
| 10,716,398 B1* | 7/2020 | Chen | ............... | A47B 88/44 |
| 10,736,422 B2 | 8/2020 | Chen | | |
| 10,806,255 B1* | 10/2020 | Chen | ............... | A47B 88/443 |
| 10,918,209 B1* | 2/2021 | Chen | ............... | A47B 88/57 |
| 10,980,346 B2 | 4/2021 | Chen | | |
| 11,076,694 B2* | 8/2021 | Chen | ............... | A47B 88/49 |
| 11,134,776 B2* | 10/2021 | Chen | ............... | H05K 7/1489 |
| 11,246,410 B2* | 2/2022 | Chen | ............... | A47B 88/57 |
| 2018/0031037 A1* | 2/2018 | Chen | ............... | A47B 88/49 |
| 2018/0070723 A1* | 3/2018 | Chen | ............... | A47B 88/49 |
| 2019/0082836 A1* | 3/2019 | Chen | ............... | F16C 29/045 |
| 2019/0274428 A1* | 9/2019 | Chen | ............... | H05K 7/1489 |
| 2020/0392990 A1* | 12/2020 | Chen | ............... | F16C 29/04 |

FOREIGN PATENT DOCUMENTS

| | | |
|---|---|---|
| JP | 3177386 U | 8/2012 |
| JP | 2017-127625 A | 7/2017 |
| JP | 2019-118792 A | 7/2019 |
| JP | 2020-192306 A | 12/2020 |
| TW | I704889 B | 9/2020 |
| TW | I706749 B | 10/2020 |

* cited by examiner

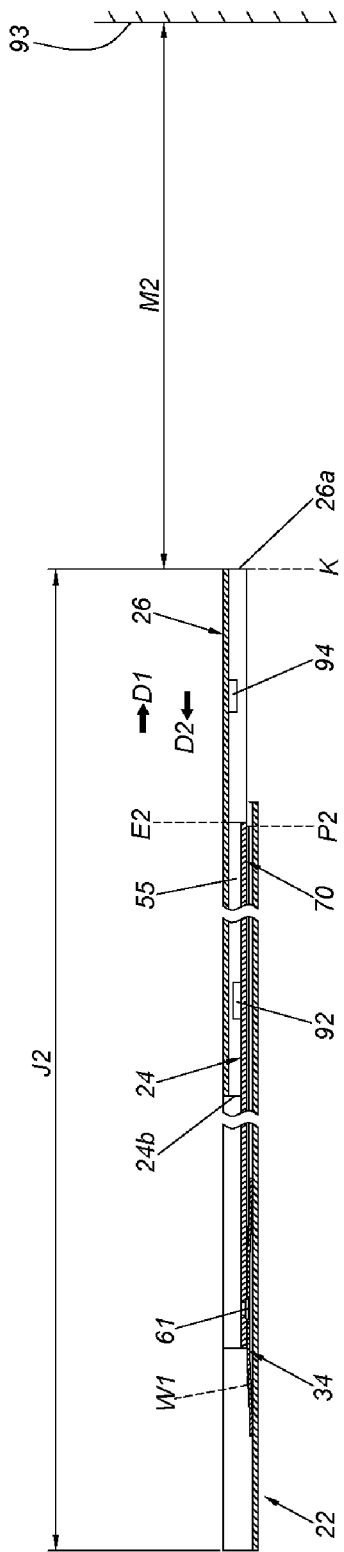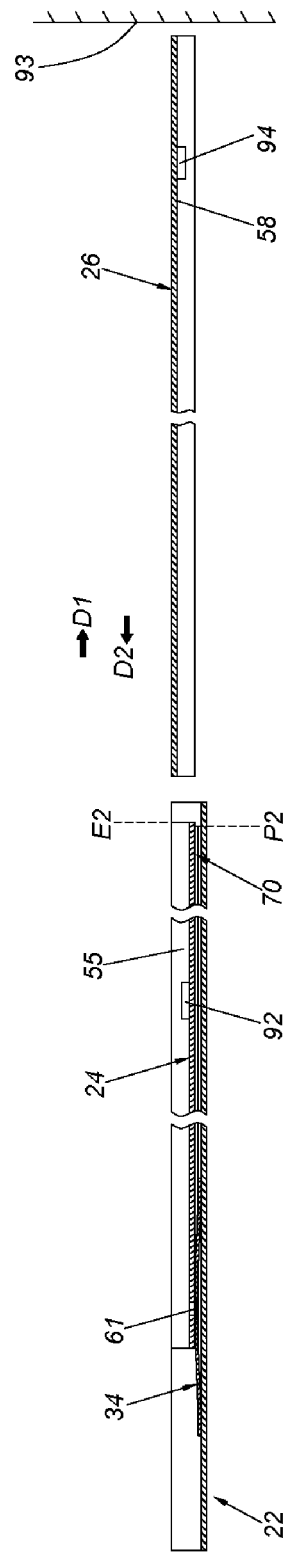

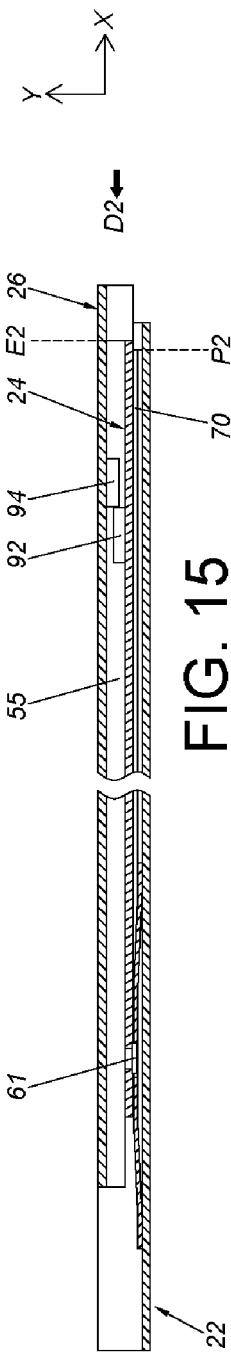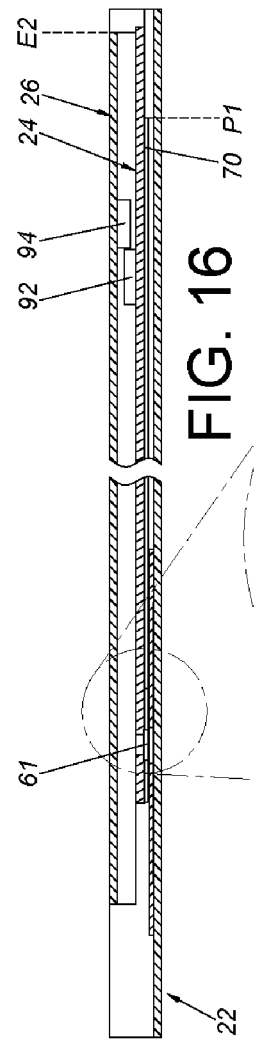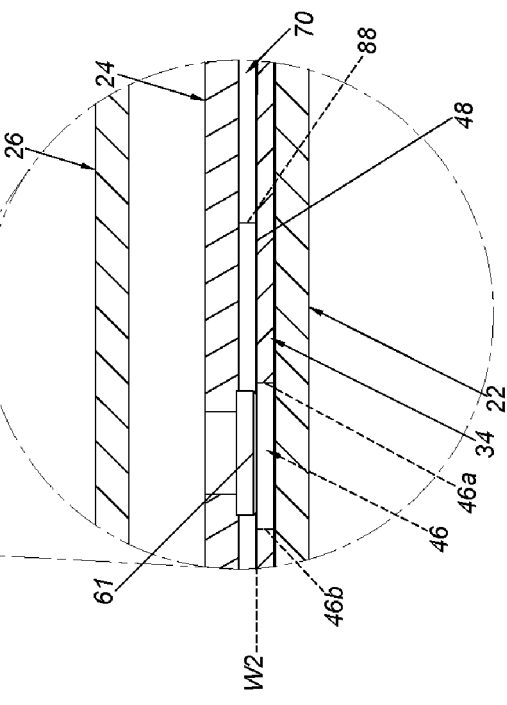

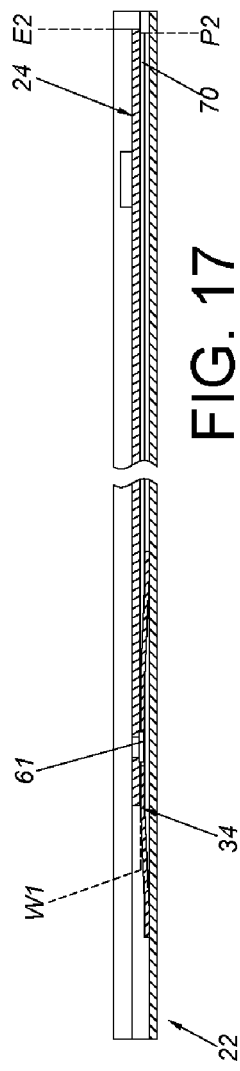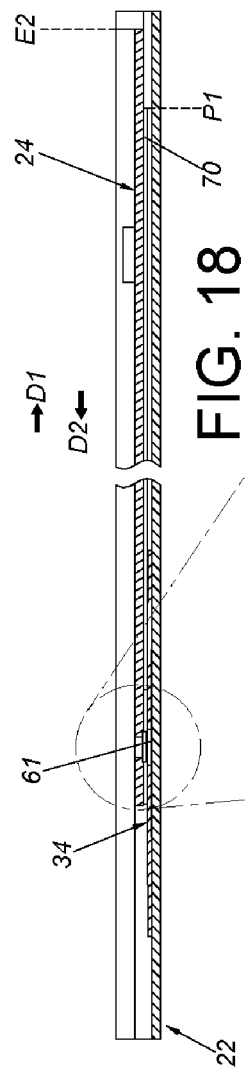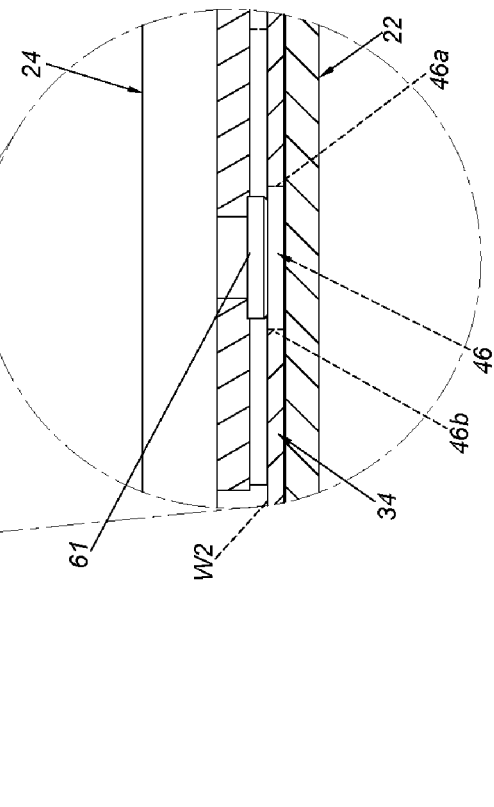

SLIDE RAIL ASSEMBLY

BACKGROUND OF THE INVENTION

1. Field of the Invention

The present invention relates to a slide rail assembly, in which a mutual blocking relationship between two slide rails is capable of being released through an operation member.

2. Description of the Prior Art

As shown in the U.S. Pat. No. 10,041,535 B2, a slide rail assembly including a first rail, a second rail, a third rail, a locking member and an operation member is disclosed. The second rail is capable of moving relative to the first rail from a first position to a second position. The third rail is capable of moving relative to the second rail. The locking member is mounted to the second rail for locking a portion of the first rail when the second rail is at the second position, such that the second rail is incapable of being moved relative to the first rail from the second position to the first position. A user can apply a force to the operation member to allow the operation member to displace relative to the second rail from a first predetermined position to a second predetermined position, such that the locking member is released from locking the portion of the first rail.

As shown in the U.S. Pat. No. 9,681,749 B2, a slide rail assembly including a first rail, a second rail, a blocking member, a positioning member and an operation member is disclosed. The blocking member is attached to the first rail. The positioning member is arranged at the second rail. The operation member is movably connected to the first rail. When the second rail is displaced relative to the first rail to an extending position, the second rail is prevented from retracting from the extending position along a retracting direction through the positioning member being blocked by the blocking member. The operation member is capable of being displaced from an initial position to a predetermined position through a force applied by a user. During the process that the operation member is displaced to the predetermined position, the operation member drives the blocking member of the first rail, such that the blocking member is in an unblocking state which is incapable of blocking the positioning member any longer, and the second rail is allowed to retract from the extending position along the retracting direction.

However, depending on different market demands, sometimes it is not desirable to use the methods of the above two patents for releasing the mutual blocking relationship between two slide rails. Therefore, development of a different product to satisfy various market demands becomes an issue that cannot be ignored.

SUMMARY OF THE INVENTION

According to one aspect of the present invention, a slide rail assembly includes a first rail, a second rail, a working member and an operation member. The first rail includes a blocking member and a positioning member. The blocking member includes an elastic material. The second rail is capable of displacing relative to the first rail. The second rail includes a predetermined feature. The working member is mounted to the second rail. The operation member is for operating the blocking member. When the second rail is at a first extending position relative to the first rail, the blocking member is in a blocking state capable of blocking the working member so as to prevent the second rail from displacing from the first extending position along a retracting direction. The operation member is capable of being operated to move from a first operation position to a second operation position to drive the blocking member to leave the blocking state, such that the blocking member is incapable of blocking the working member so as to allow the second rail to displace from the first extending position along the retracting direction. When the second rail is displaced relative to the first rail from the first extending position to a second extending position along the retracting direction, the second rail is engaged with the positioning member through the predetermined feature so as to prevent the second rail from leaving the second extending position.

Preferably, the slide rail assembly further includes a third rail. The second rail is movably mounted between the first rail and the third rail.

Preferably, the positioning member includes an elastic material.

Preferably, the positioning member includes a positioning portion. During a process that the second rail is displaced from the first extending position to the second extending position along the retracting direction, the second rail drives the positioning member to move from a first predetermined state to a second predetermined state through the predetermined feature, such that the positioning member accumulates an elastic force. When the second rail reaches the second extending position, the positioning member returns from the second predetermined state to the first predetermined state in response to the release of the elastic force, such that the positioning member is engaged with the predetermined feature through the positioning portion to prevent the second rail from leaving the second extending position.

Preferably, when the second rail is at the first extending position relative to the first rail, the slide rail assembly has a first length. When the second rail is at the second extending position relative to the first rail, the slide rail assembly has a second length less than the first length.

Preferably, when the second rail is at the second extending position, the third rail is capable of being displaced relative to the second rail along an opening direction so as to be detached from a passage of the second rail.

Preferably, the operation member is operably mounted to the second rail.

Preferably, when the third rail is reinserted into the passage of the second rail from an outside of the passage of the second rail along the retracting direction, the third rail drives the operation member to move relative to the second rail from the second operation position to the first operation position to drive the positioning member to leave the first predetermined state, such that the positioning portion of the positioning member is no longer engaged with the predetermined feature so as to allow the second rail to displace from the second extending position along the retracting direction.

Preferably, the positioning member is driven to leave the first predetermined state through the operation member being operably moved from the second operation position to the first operation position, such that the positioning portion of the positioning member is no longer engaged with the predetermined feature so as to allow the second rail to displace from the second extending position along the retracting direction.

Preferably, the working member is movably mounted to the second rail, and the slide rail assembly further includes an elastic member for providing an elastic force to the working member.

According to another aspect of the present invention, a slide rail assembly includes a first rail, a second rail and an operation member. The first rail includes a blocking member and a positioning member. The second rail is capable of displacing relative to the first rail. When the second rail is at a first extending position relative to the first rail, the blocking member is for blocking the second rail so as to prevent the second rail from displacing from the first extending position along a retracting direction. The blocking member is driven through the operation member being operably moved from a first operation position to a second operation position, such that the blocking member is incapable of blocking the second rail to allow the second rail to displace from the first extending position along the retracting direction. When the second rail is displaced relative to the first rail from the first extending position to a second extending position along the retracting direction, the positioning member is for blocking the second rail so as to prevent the second rail from leaving the second extending position. The positioning member is driven through the operation member being operably moved from the second operation position to the first operation position, such that the positioning member is incapable of blocking the second rail to allow the second rail to leave the second extending position.

According to yet another aspect of the present invention, a slide rail assembly includes a first rail, a second rail and an operation member. The first rail includes a positioning member. The second rail is capable of displacing relative to the first rail. The second rail includes a predetermined feature. When the second rail is displaced relative to the first rail from a first extending position to a second extending position along a retracting direction, the second rail is engaged with the positioning member through the predetermined feature to prevent the second rail from leaving the second extending position. The positioning member is driven through the operation member being operably moved from an operation position to another operation position, such that the predetermined feature is no longer engaged with the positioning member so as to allow the second rail to leave the second extending position.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 13 is a schematic diagram showing the slide rail assembly applied to the environment with limited space and the slide rail assembly in another extending state according to the embodiment of the present invention.

FIG. 14 is a schematic diagram showing the slide rail assembly applied to the environment with limited space and the slide rail assembly in the another extending state to allow the third rail to be detached from the second rail along an opening direction according to the embodiment of the present invention.

FIG. 15 is a schematic diagram showing the third rail of the slide rail assembly being remounted to the second rail along the retracting direction according to the embodiment of the present invention.

FIG. 16 is a schematic diagram showing the third rail of the slide rail assembly being continuously displaced relative to the second rail along the retracting direction according to the embodiment of the present invention.

FIG. 17 is a schematic diagram showing the slide rail assembly in another extending state and the operation member at the another position according to the embodiment of the present invention.

FIG. 18 is a schematic diagram showing the slide rail assembly in the another extending state and the operation member at the position according to the embodiment of the present invention.

DETAILED DESCRIPTION

Figure 1:
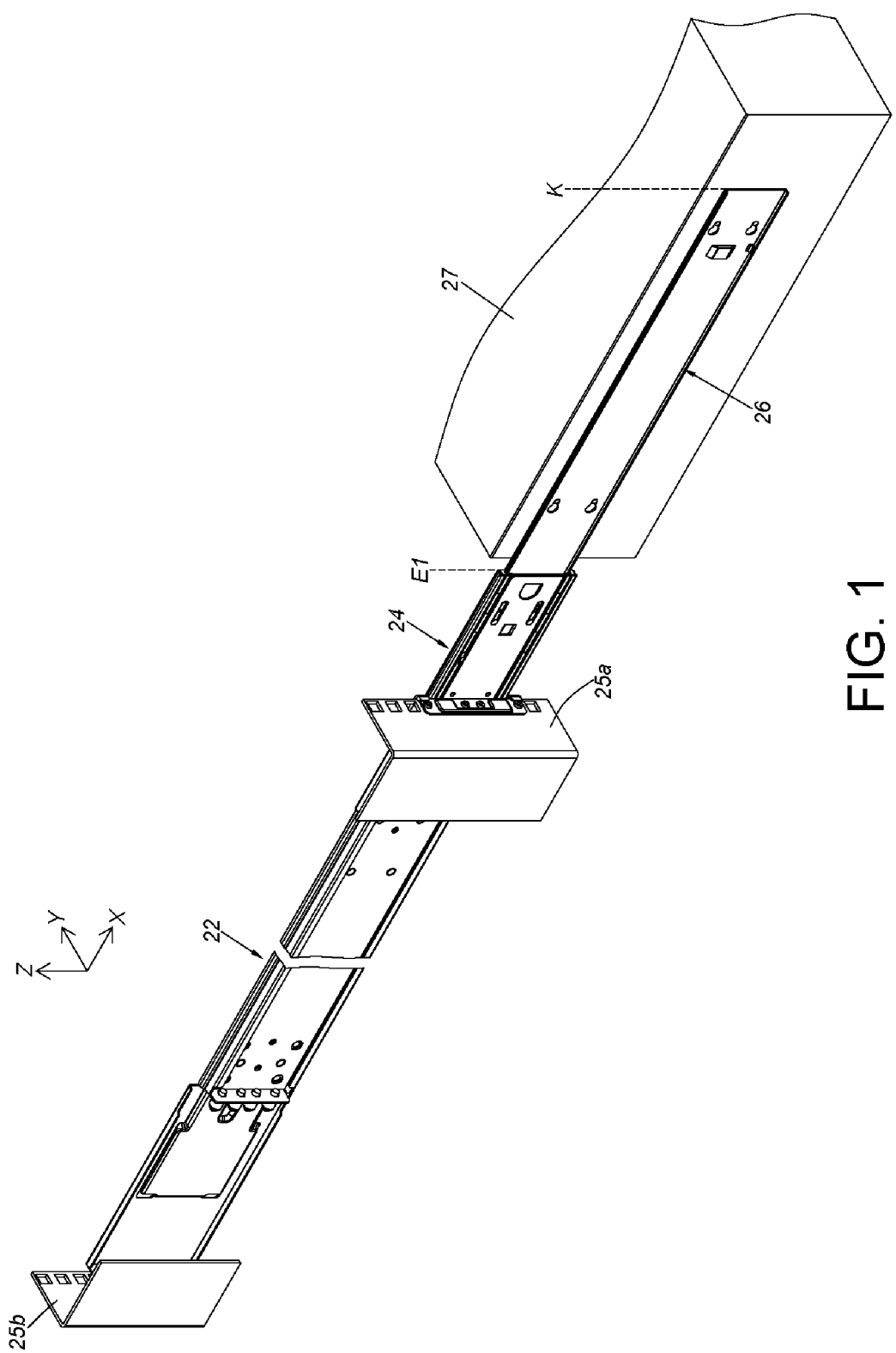
FIG. 1 is a three-dimensional diagram showing a slide rail assembly applicable to a rack and including a first rail, a second rail and a third rail according to an embodiment of the present invention.

As shown in FIG. 1, according to an embodiment of the present invention, a slide rail assembly includes a first rail 22 and a second rail 24. Preferably, the slide rail assembly can further include a third rail 26. The second rail 24 is movably mounted between the first rail 22 and the third rail 26. The first rail 22 can be mounted to a rack (a first post 25a and a second post 25b thereof). The third rail 26 can be configured to carry a carried object 27. The first rail 22 (such as an outer rail), the second rail 24 (such as a middle rail) and the third rail 26 (such as an inner rail) are capable of longitudinally displacing relative to each other. The slide rail assembly is capable of in a fully extending state. Moreover, in the embodiment, the X-axis direction is a longitudinal direction (or a length direction or a displacement direction of a slide rail), the Y-axis direction is a transverse direction (or a lateral direction of the slide rail), and the Z-axis direction is a vertical direction (or a height direction of the slide rail). Each of the first rail 22, the second rail 24 and the third rail 26 is a slide rail.

Figure 2:
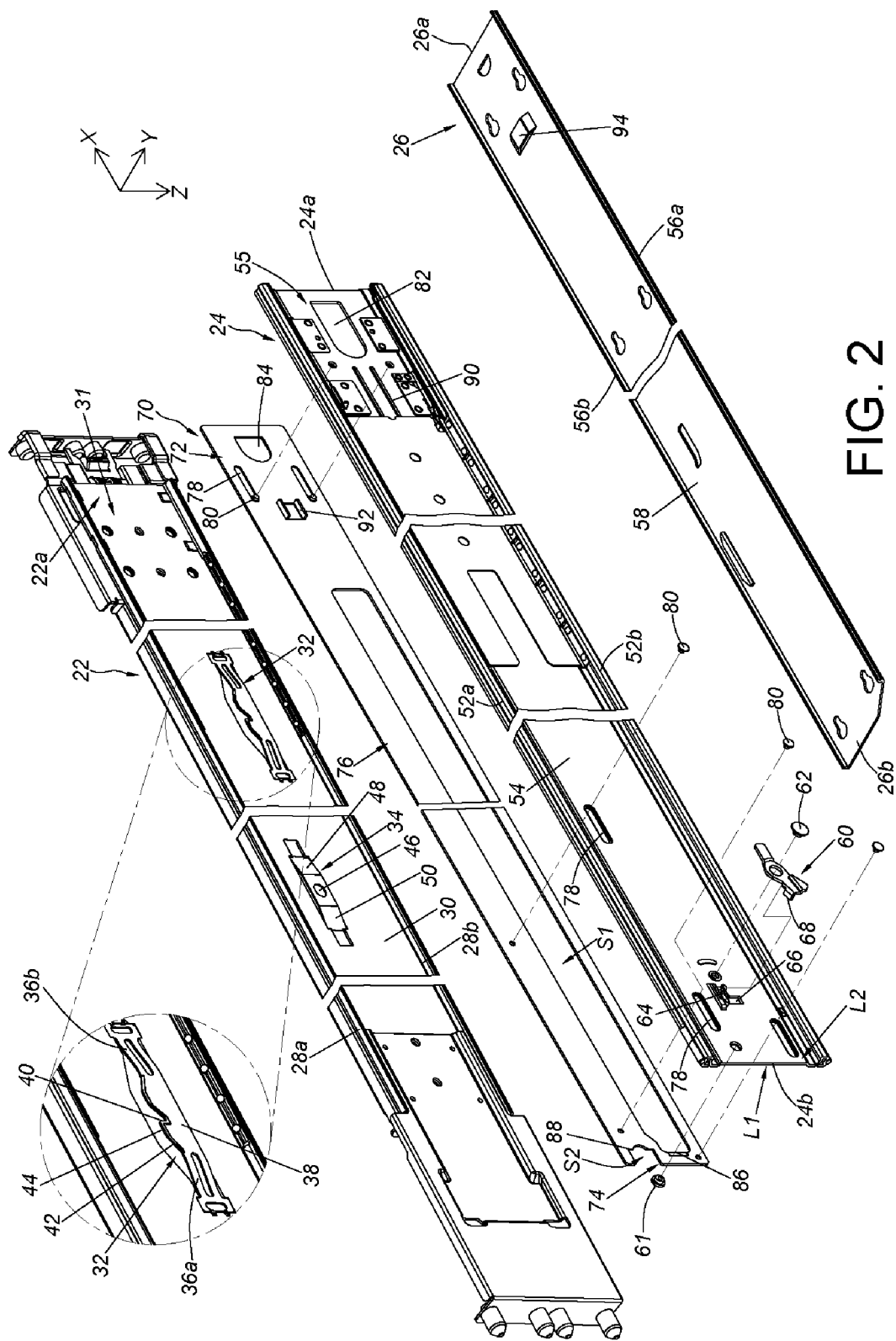
FIG. 2 is an exploded diagram showing the slide rail assembly according to the embodiment of the present invention.

As shown in FIG. 2, the first rail 22 includes a first wall 28*a*, a second wall 28*b* and a longitudinal wall 30 connected between the first wall 28*a* and the second wall 28*b* of the first rail 22. The first wall 28*a*, the second wall 28*b* and the longitudinal wall 30 of the first rail 22 together define a first passage 31 . The first passage 31 is for accommodating the second rail 24. The first rail 22 includes a blocking member 32 and a positioning member 34. At least one of the blocking member 32 and the positioning member 34 includes an elastic material. Herein, both of the blocking member 32 and the positioning member 34 are elastic components (such as elastic seats or spring leafs) , which is only exemplary, and the present invention is not limited thereto.

Preferably, both of the blocking member 32 and the positioning member 34 are arranged at the longitudinal wall 30 of the first rail 22.

Preferably, the blocking member 32 includes a first guiding portion 36*a*, a second guiding portion 36*b* and a supporting structure 38. An end of the first guiding portion 36*a* and an end of the second guiding portion 36*b* are connected to the longitudinal wall 30 of the first rail 22. Both of the first guiding portion 36*a* and the second guiding portion 36*b* may exemplarily be inclined surfaces or curved surfaces. The supporting structure 38 is located between the first guiding portion 36*a* and the second guiding portion 36*b*. The supporting structure 38 includes a blocking section 40, a guiding section 42 and a longitudinal section 44. Herein, the blocking section 40 is a blocking wall (or an upright wall), which is only exemplary, and the present invention is not limited thereto. The longitudinal section 44 is located between the blocking section 40 and the guiding section 42. The guiding section 42 may exemplarily be an inclined surface or a curved surface. Herein, the blocking member 32 is exemplarily an elastic sheet structure, and protrudes from the longitudinal wall 30 of the first rail 22 and faces toward the second rail 24.

Preferably, the positioning member 34 includes a positioning portion 46. Herein, the positioning portion 46 is an edge wall of a space (such as a hole), which is only exemplary, and the present invention is not limited thereto.

Preferably, the positioning member 34 further includes a first guiding feature 48 and a second guiding feature 50, and the positioning portion 46 is located between the first guiding feature 48 and the second guiding feature 50. Surfaces of the first guiding feature 48 and the second guiding feature 50 may exemplarily be inclined surfaces or curved surfaces. Herein, the positioning member 34 is exemplarily an elastic sheet structure, and protrudes from the longitudinal wall 30 of the first rail 22 and faces toward the second rail 24.

The blocking member 32 and the positioning member 34 are spaced by a distance along the X-axis direction, and the blocking member 32 is closer to a front end portion 22*a* of the first rail 22 than the positioning member 34. The blocking member 32 and the positioning member 34 are spaced by a distance along the Z-axis direction.

The second rail 24 includes a first wall 52*a*, a second wall 52*b* and a longitudinal wall 54 connected between the first wall 52*a* and the second wall 52*b* of the second rail 24. The first wall 52*a*, the second wall 52*b* and the longitudinal wall 54 of the second rail 24 together define a second passage 55. The second passage 55 is for accommodating the third rail 26. The third rail 26 includes a first wall 56*a*, a second wall 56*b* and a longitudinal wall 58 connected between the first wall 56*a* and the second wall 56*b* of the third rail 26.

Figure 3:
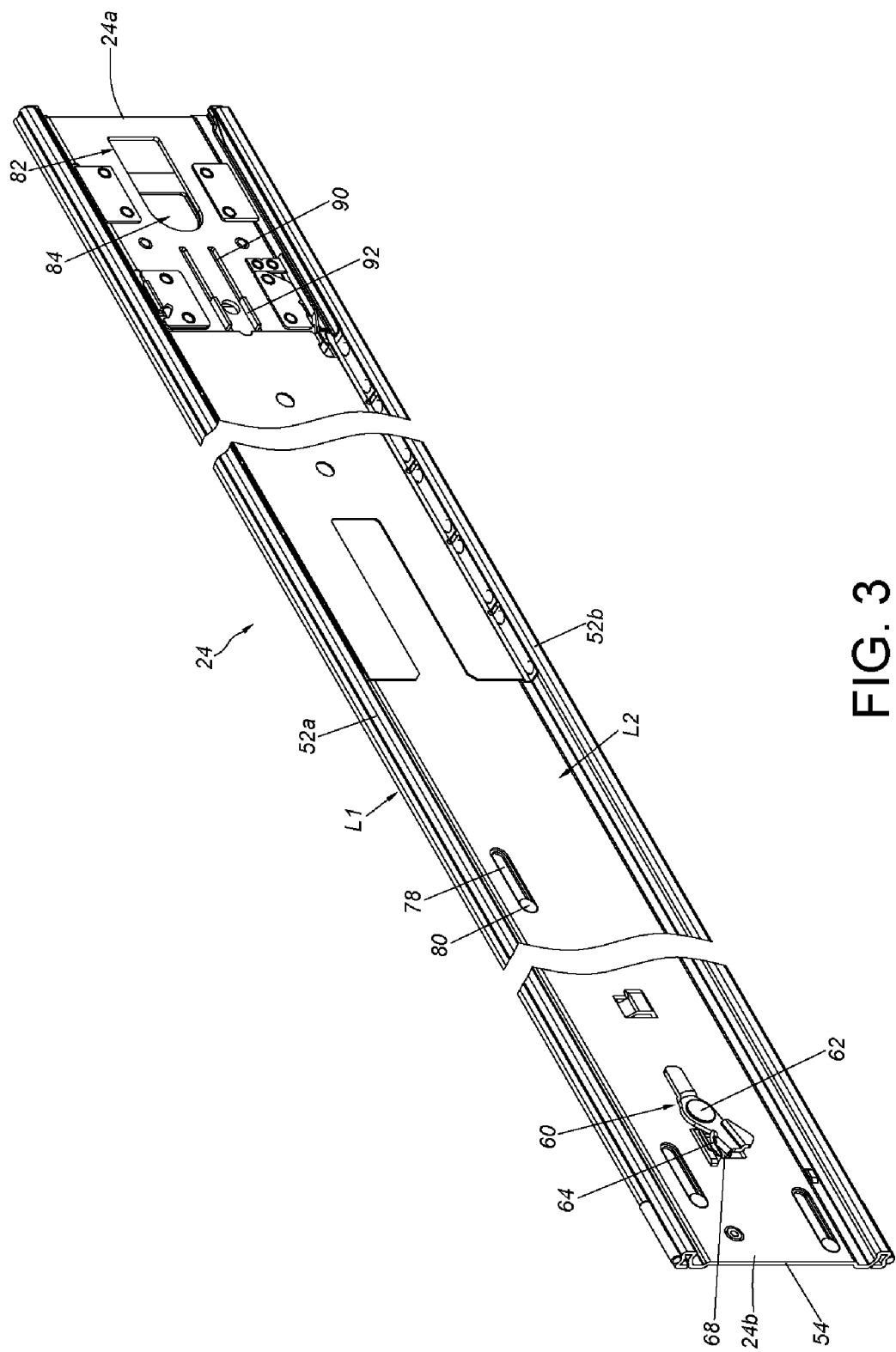
FIG. 3 is a three-dimensional diagram showing a second rail in a first view angle according to the embodiment of the present invention.
Figure 4:
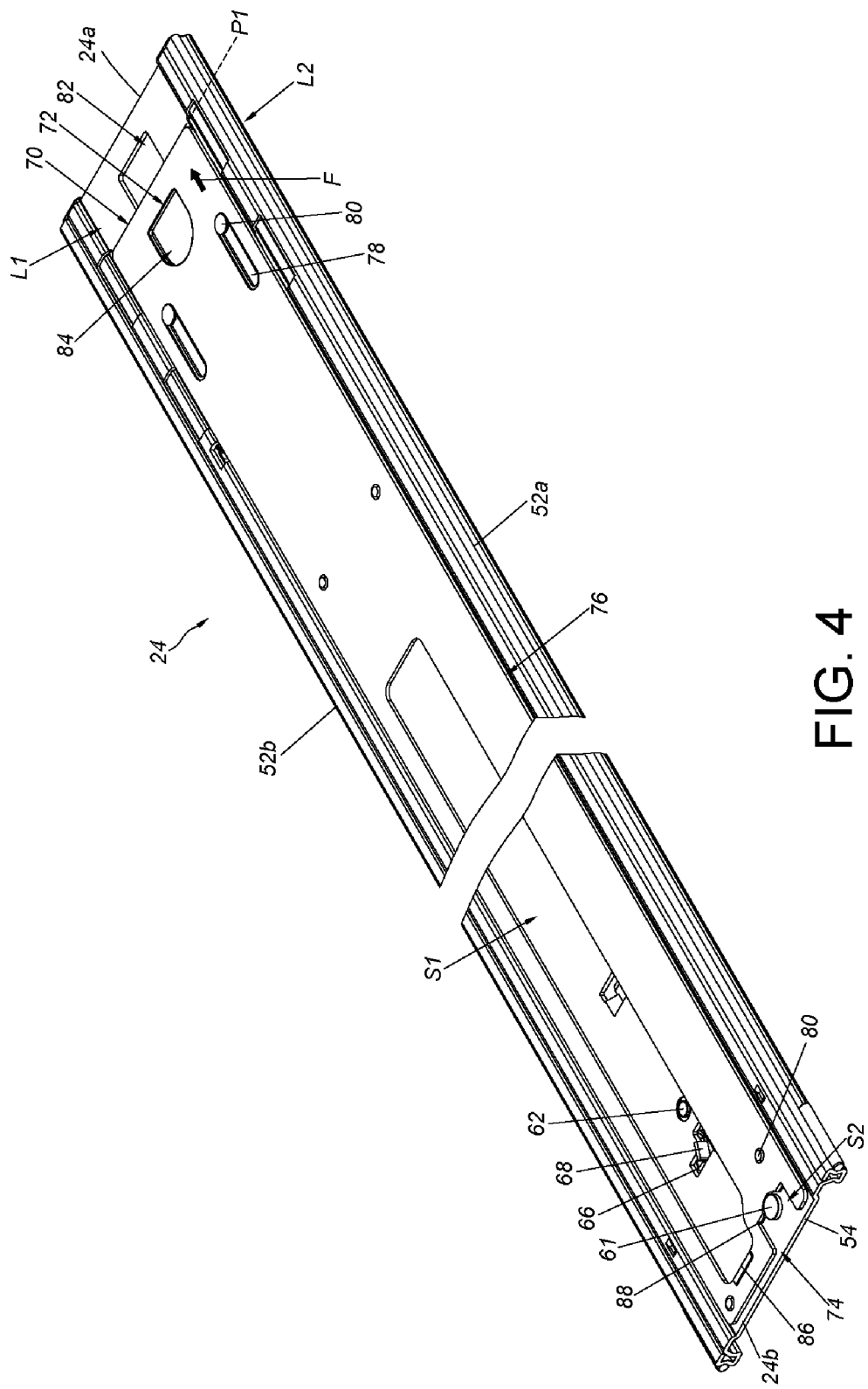
FIG. 4 is a three-dimensional diagram showing the second rail in a second view angle and an operation member at a position according to the embodiment of the present invention.

As shown in FIG. 2 to FIG. 4, the second rail 24 has a first side L1 and a second side L2 opposite to the first side L1. The first side L1 is adjacent to the first rail 22, and the second side L2 is adjacent to the third rail 26. The second rail 24 includes a predetermined feature 61. The predetermined feature 61 is configured to be cooperated with the positioning member 34 of the first rail 22.

Preferably, the predetermined feature 61 is a protrusion arranged on the first side L1 of the longitudinal wall 54 of the second rail 24. Herein, the predetermined feature 61 is a fixing pin connected to the longitudinal wall 54 of the second rail 24, which is only exemplary, and the present disclosure in not limited thereto. For example, in other embodiment, the predetermined feature 61 can be a protruding portion integrally formed on the longitudinal wall 54 of the second rail 24.

Preferably, the slide rail assembly further includes a working member 60 movably mounted to the second rail 24. Herein, the working member 60 is pivotally connected to the second side L2 of the longitudinal wall 54 of the second rail 24 through a shaft member 62, which is only exemplary, and the present disclosure in not limited thereto.

Preferably, the slide rail assembly further includes an elastic member 64 for providing an elastic force to the working member 60.

Preferably, the longitudinal wall 54 of the second rail 24 has a through hole 66 communicating the first side L1 and the second side L2 of the second rail 24. The working member 60 includes an extending portion 68 passing through a portion of the through hole 66 and protruding from the first side L1 of the second rail 24. The extending portion 68 is configured to be cooperated with the blocking member 32 of the first rail 22.

The slide rail assembly includes an operation member 70 for operating the blocking member 32 and the positioning member 34. The operation member 70 is operably mounted to the second rail 24. For example, the operation member 70 is movably mounted to the first side L1 of the longitudinal wall 54 of the second rail 24. The operation member 70 includes an operation portion 72, a driving portion 74 and a middle portion 76 connected between the operation portion 72 and the driving portion 74.

Preferably, the operation portion 72 is adjacent to a front end portion 24a of the second rail 24, and the driving portion 74 is adjacent to a rear end portion 24b of the second rail 24.

Preferably, the second rail 24 and the operation member 70 have limiting features cooperated with each other, such that the operation member 70 is capable of longitudinally moving relative to the second rail 24 within a limited range. Herein, the second rail 24 and the operation member 70 are mounted to each other through at least one connecting member 80 passing through a portion of at least one elongated hole 78, which is only exemplary, and the present disclosure in not limited thereto. That is, in the embodiment, the limiting features of the second rail 24 and the operation member 70 are the at least one connecting member 80 and the at least one elongated hole 78.

Preferably, a first opening 82 is formed on the longitudinal wall 54 of the second rail 24. A second opening 84 is formed on the operation member 70. The second opening 84 is corresponding to the first opening 82 and a size of the second opening 84 is less than a size of the first opening 82. The operation portion 72 is adjacent to the second opening 84. The second opening 84 is adapted to be passed through by a finger of the user to allow the user to apply a force to the operation portion 72, so as to drive the operation member 70 to move.

Preferably, the driving portion 74 of the operation member 70 includes a first driving section 86 and a second driving section 88 located at different heights. The first driving section 86 is for driving the blocking member 32 to move elastically. The second driving section 88 is for driving the positioning member 34 to move elastically.

The height of the first driving section 86 is corresponding to a height of the blocking member 32. The height of the second driving section 88 is corresponding to a height of the positioning member 34.

Preferably, the operation member 70 further includes a first space S1 and a second space S2 communicating two sides of the operation member 70. The first driving section 86 is located behind the first space S1, and the second driving section 88 is located in front of the second space S2 (as shown in FIG. 4).

Preferably, the extending portion 68 of the working member 60 extends to the first space S1 of the operation member 70 (as shown in FIG. 4).

Preferably, at least one extending hole 90 is formed on the longitudinal wall 54 of the second rail 24 for communicating the first side L1 and the second side L2 of the second rail 24. The operation member 70 further includes at least one auxiliary portion 92 passing through a portion of the at least one extending hole 90 and stretching out from the second side L2 of the second rail 24.

Figure 5:
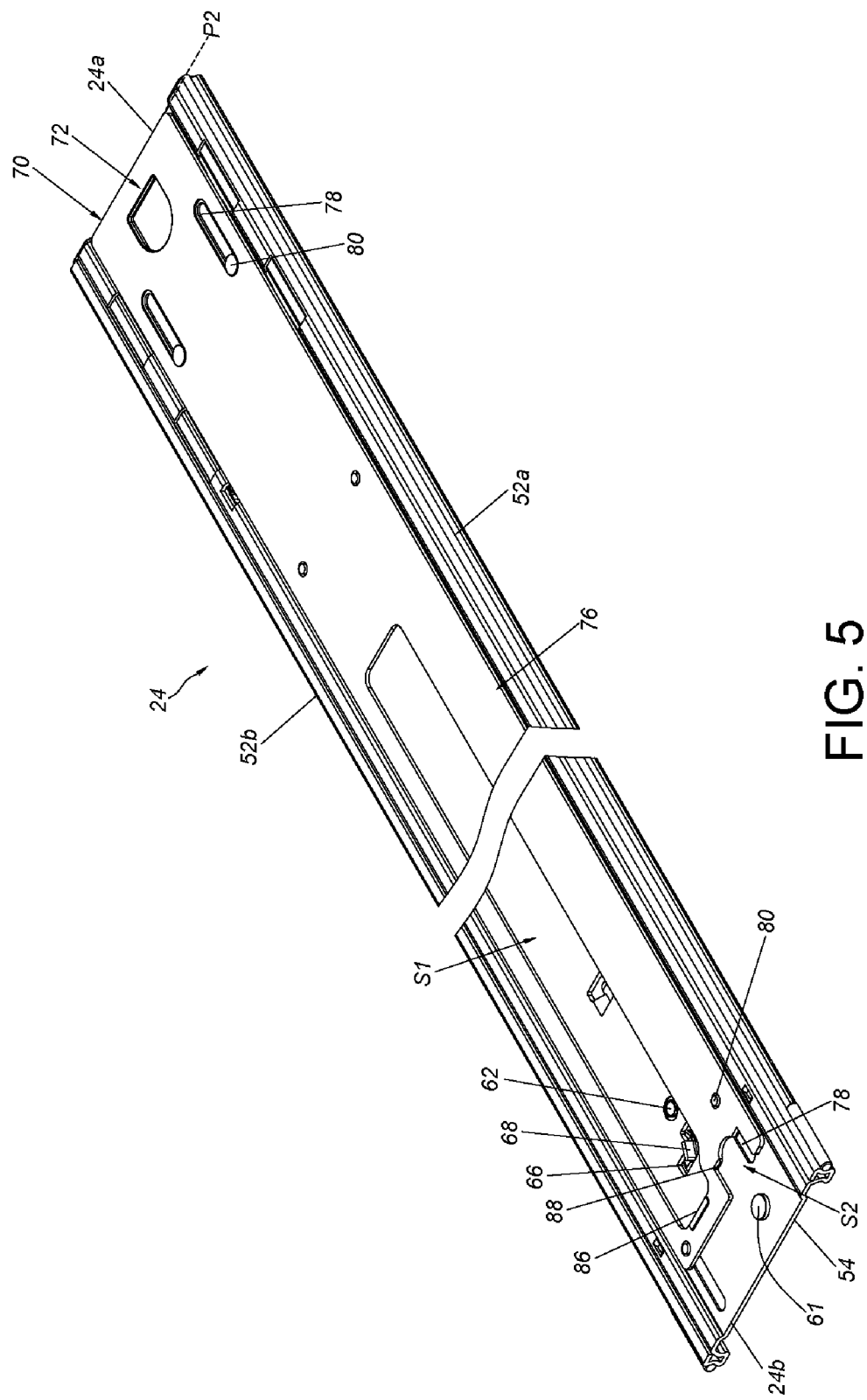
FIG. 5 is a three-dimensional diagram showing the second rail in the second view angle and the operation member at another position according to the embodiment of the present invention.

As shown in FIG. 4 and FIG. 5, the operation member 70 is capable of being operated to move between a first operation position P1 (as shown in FIG. 4) and a second operation position P2 (as shown in FIG. 5). For example, the user can apply a force F to the operation member 70 to allow the operation member 70 to move from the first operation position P1 to the second operation position P2. Alternatively, the operation member 70 can be applied with another force to allow the operation member 70 to return to the first operation position P1 from the second operation position P2.

Preferably, when the operation member 70 is located at the first operation position P1 relative to the second rail 24, the predetermined feature 61 of the second rail 24 is located inside the second space S2, and the predetermined feature 61 of the second rail 24 and the second driving section 88 of the operation member 70 are close to each other (as shown in FIG. 4). Alternatively, when the operation member 70 is located at the second operation position P2 relative to the second rail 24, the predetermined feature 61 of the second rail 24 is located outside the second space S2, and the predetermined feature 61 of the second rail 24 and the second driving section 88 of the operation member 70 are far away from each other (as shown in FIG. 5).

Figure 6:
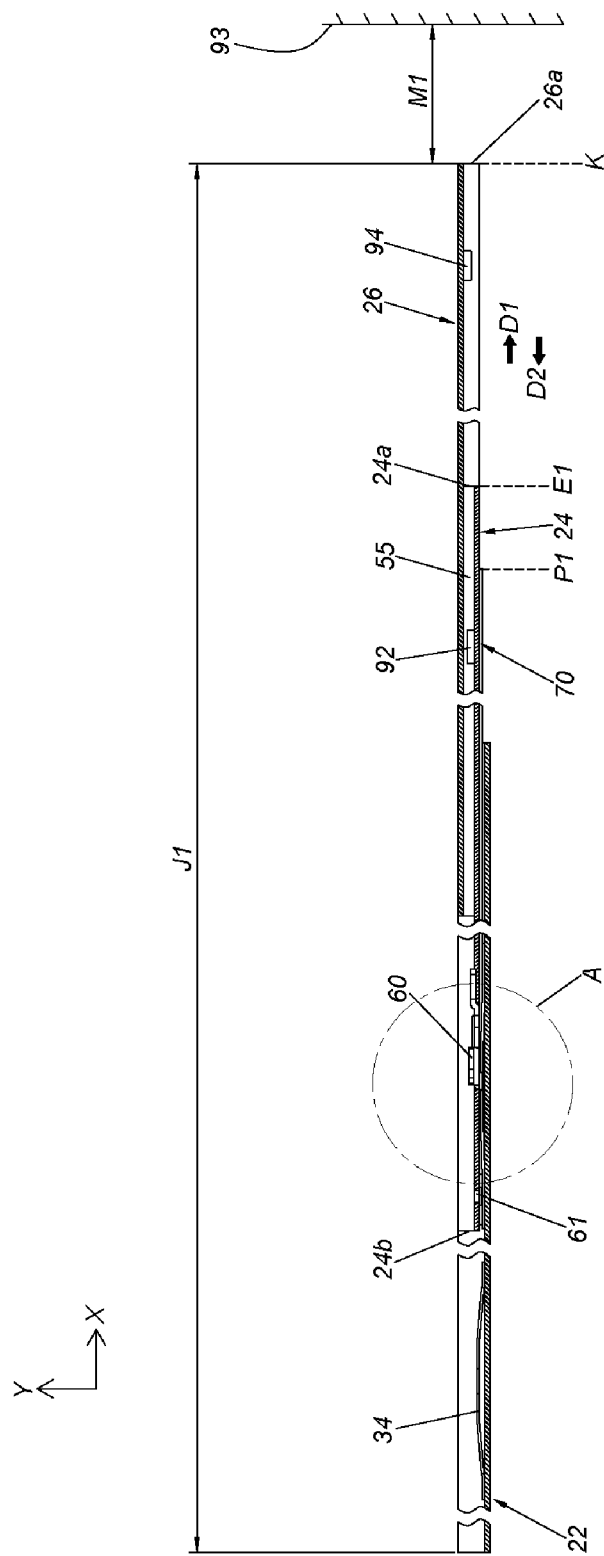
FIG. 6 is a schematic diagram showing the slide rail assembly applied to an environment with limited space and the slide rail assembly in an extending state according to the embodiment of the present invention.
Figure 7:
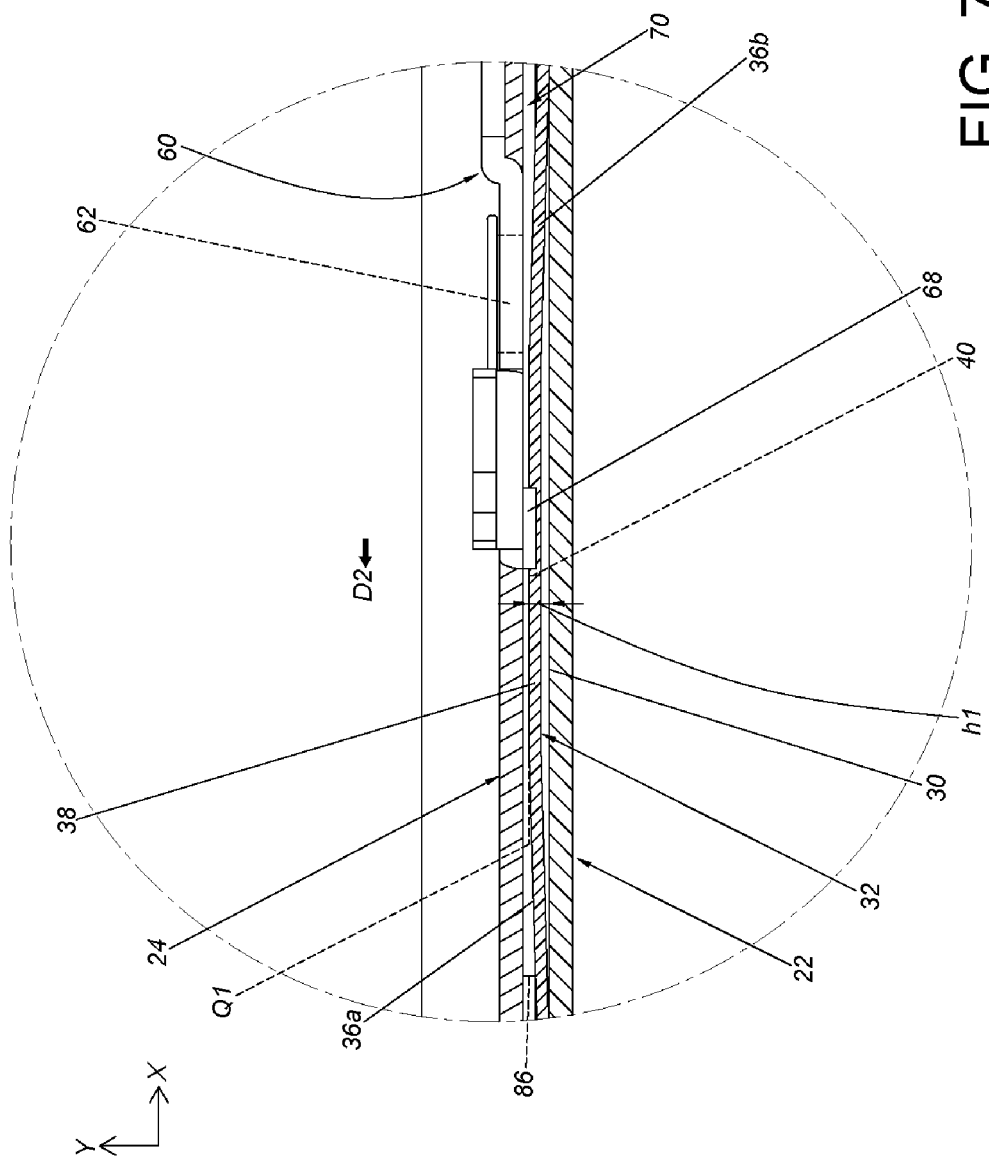
FIG. 7 is an enlarged view of a region A of FIG. 6.

As shown in FIG. 6 and FIG. 7, the slide rail assembly is applied to an environment with limited space. When the slide rail assembly is in the fully extending state, the second rail 24 is at a first extending position E1 relative to the first rail 22, and the third rail 26 is at an opening position K (as shown in FIG. 6) relative to the second rail 24. When the second rail 24 is at the first extending position E1 relative to the first rail 22, the slide rail assembly has a first length J1, and a first distance M1 is between the front end portion 26a of the third rail 26 and an object 93 (such as a door or an obstacle). Because the first distance M1 is too short, the third rail 26 is incapable of being detached from the second passage 55 of the second rail 24 along an opening direction D1.

When the second rail 24 is at the first extending position E1 relative to the first rail 22, the blocking member 32 of the first rail 22 is in a blocking state Q1 capable of blocking the working member 60 (i.e., blocking the second rail 24; as shown in FIG. 7), so as to prevent the second rail 24 from displacing from the first extending position E1 along a retracting direction D2. Specifically, when the blocking member 32 is in the blocking state Q1, a top surface of the supporting structure 38 of the blocking member 32 and a surface of the longitudinal wall 30 of the first rail 22 together form a lateral height h1, and the blocking section 40 of the supporting structure 38 is capable of blocking the extending portion 68 of the working member 60 (as shown in FIG. 7), so as to prevent the second rail 24 from displacing from the first extending position E1 along the retracting direction D2. Wherein, the operation member 70 is at the first operation position P1 relative to the second rail 24, and the first driving section 86 of the operation member 70 is adjacent to the first guiding portion 36a of the blocking member 32.

Figure 8:
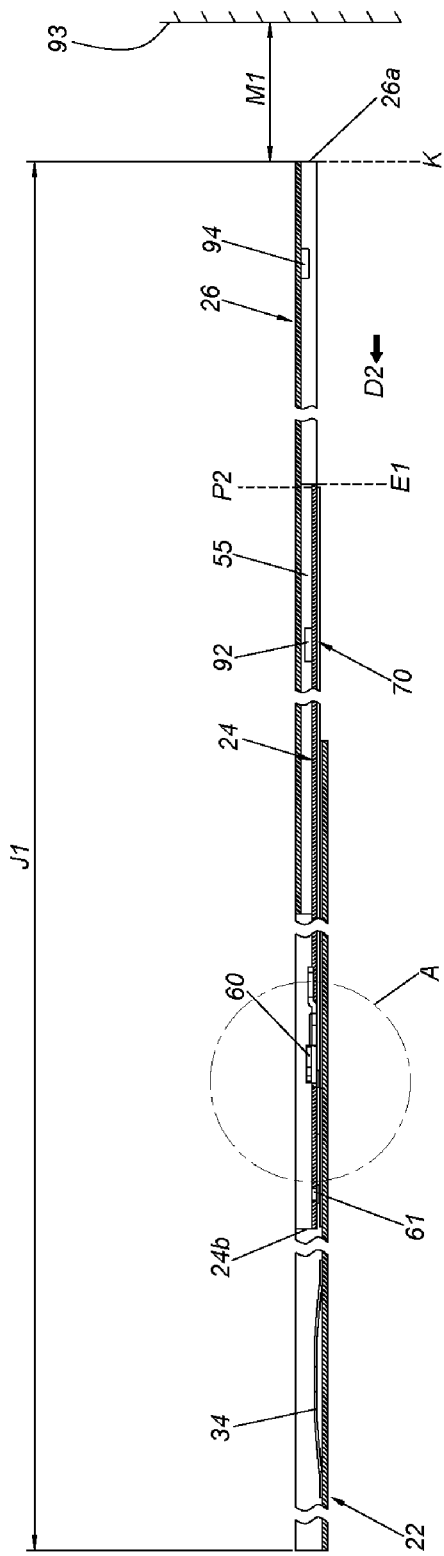
FIG. 8 is a schematic diagram showing the slide rail assembly applied to the environment with limited space and the slide rail assembly in the extending state according to the embodiment of the present invention.
Figure 9:
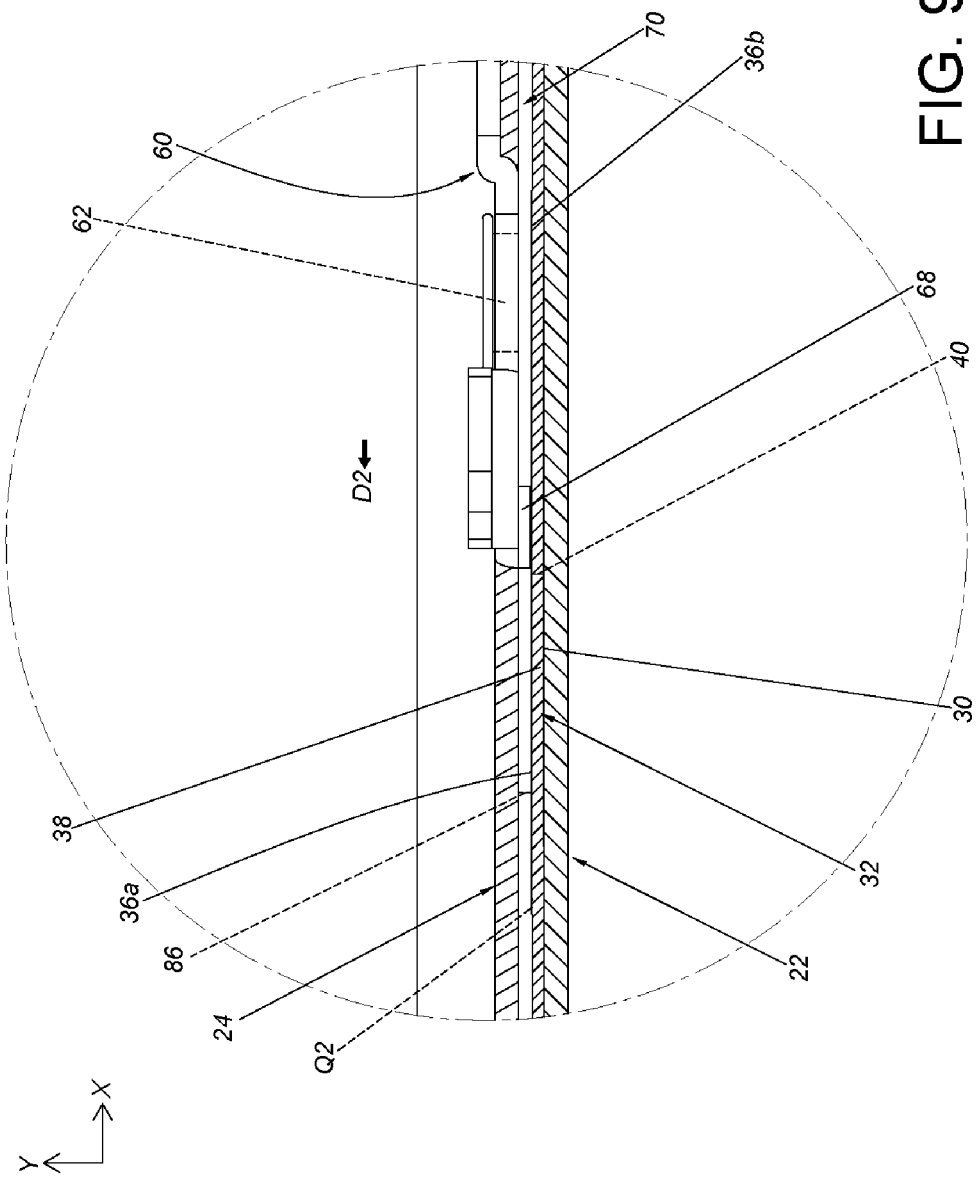
FIG. 9 is an enlarged view of a region A of FIG. 8.

As shown in FIG. 8 and FIG. 9, with the operation member 70 being operably moved from the first operation position P1 to the second operation position P2, the blocking member 32 is driven to leave the blocking state Q1 (For example, the blocking member 32 is in an unblocking state Q2), such that the blocking member 32 is incapable of blocking the working member 60 so as to allow the second rail 24 to displace from the first extending position E1 along the retracting direction D2. Specifically, when the operation member 70 is moved from the first operation position P1 to the second operation position P2, the operation member 70 pushes the first guiding portion 36a of the blocking member 32 through the first driving section 86, such that the blocking member 32 is moved transversely (laterally) from the blocking state Q1 to the unblocking state Q2 (as shown in FIG. 9). When the blocking member 32 is in the unblocking state Q2, the top surface of the supporting structure 38 of the blocking member 32 and the surface of the longitudinal wall 30 of the first rail 22 together form a height which is less that the lateral height h1, and the blocking section 40 of the supporting structure 38 is staggered from the extending portion 68 of the working member 60, such that the blocking section 40 of the supporting structure 38 is incapable of blocking the extending portion 68 of the working member 60 (as shown in FIG. 9) to allow the second rail 24 to displace from the first extending position E1 along the retracting direction D2. In other words, when the blocking member 32 is pushed toward the longitudinal wall 30 of the first rail 22 by the first driving section 86, the blocking member 32 is changed from the blocking state Q1 to the unblocking state Q2. Moreover, when the operation member 70 is moved from the first operation position P1 to the second operation position P2, the operation member 70 is moved relative to the second rail 24 along the opening direction D1.

Figure 10:
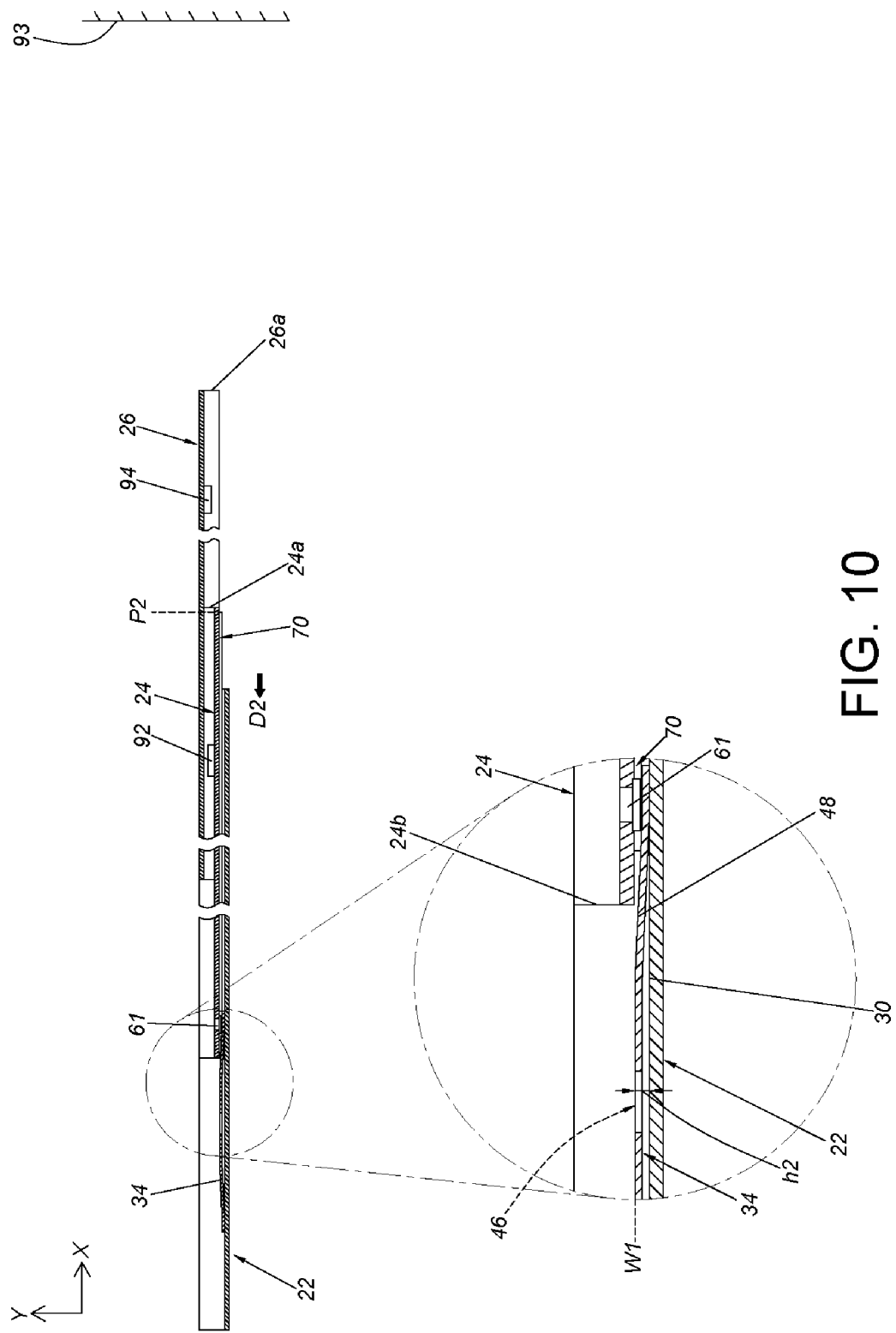
FIG. 10 is a schematic diagram showing the slide rail assembly applied to the environment with limited space and a third rail of the slide rail assembly capable of being displaced relative to the first rail along a retracting direction through the second rail according to the embodiment of the present invention.
Figures 11, 12:
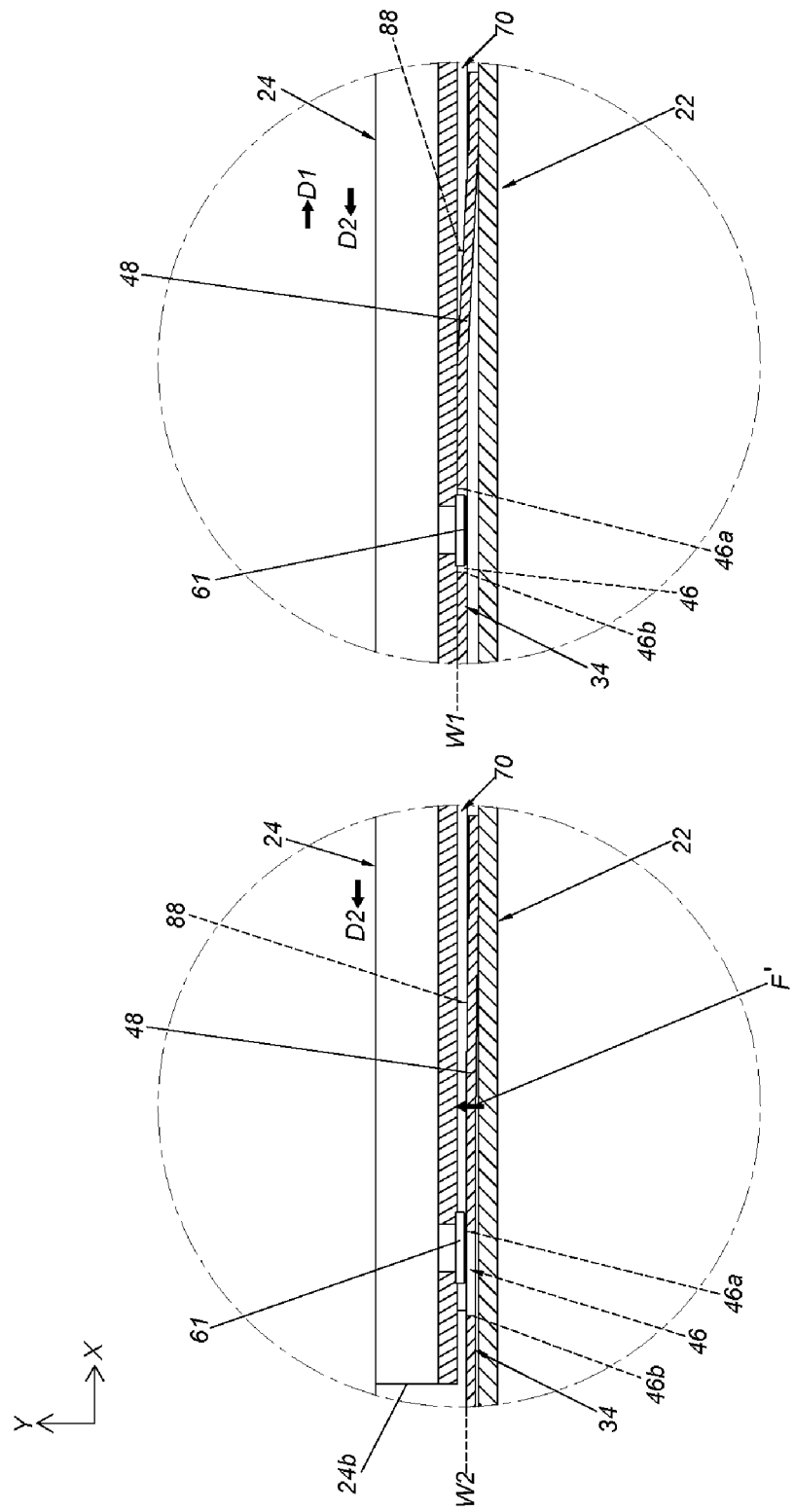
FIG. 11 is a schematic diagram showing the second rail of the slide rail assembly capable of being continuously displaced relative to the first rail along the retracting direction according to the embodiment of the present invention.
FIG. 12 is a schematic diagram showing the second rail of the slide rail assembly capable of being further displaced relative to the first rail along the retracting direction according to the embodiment of the present invention.

As shown in FIG. 10 to FIG. 13, when the second rail 24 is displaced relative to the first rail 22 from the first extending position E1 to a second extending position E2 along the retracting direction D2 (as shown in FIG. 12 and FIG. 13), the second rail 24 is engaged with the positioning member 34 through the predetermined feature 61 so as to prevent the second rail 24 from leaving the second extending position E2.

Specifically, during a process that the second rail 24 is displaced from the first extending position E1 to the second extending position E2 along the retracting direction D2, the second rail 24 contacts the first guiding feature 48 of the positioning member 34 through the predetermined feature 61 to drive the positioning member 34 to move from a first predetermined state W1 (as shown in FIG. 10) to a second predetermined state W2, such that the positioning member 34 accumulates an elastic force F' (as shown in FIG. 11). When the second rail 24 reaches the second extending position E2, the positioning member 34 returns from the second predetermined state W2 to the first predetermined state W1 (as shown in FIG. 12) in response to the release of the elastic force F', such that the positioning member 34 is engaged with the predetermined feature 61 through the positioning portion 46 so as to prevent the second rail 24 from leaving the second extending position E2 (as shown in FIG. 12 and FIG. 13). More specifically, when the positioning member 34 is in the first predetermined state W1, the positioning member 34 blocks a front end and a rear end of the predetermined feature 61 through a first wall 46a and a second wall 46b of the positioning portion 46, respectively. As such, the second rail 24 is incapable of displacing from the second extending position E2 along the opening direction D1 or the retracting direction D2 (as shown in FIG. 12 and FIG. 13). In other words, when the positioning member 34 is pushed toward the longitudinal wall 30 of the first rail 22 by the predetermined feature 61, the positioning member 34 is changed from the first predetermined state W1 to the second predetermined state W2.

As shown in FIG. 13 and FIG. 14, when the second rail 24 is at the second extending position E2 relative to the first rail 22, the slide rail assembly has a second length J2 less than the first length J1, such that a second distance M2 which is larger than the first distance M1 (as shown in FIG. 6) is between the front end portion 26a of the third rail 26 and the object 93. Accordingly, it is favorable for the third rail 26 to be displaced along the opening direction D1 so as to be detached from the second passage 55 of the second rail 24 (as shown in FIG. 14).

As shown in FIG. 2 and FIG. 14 to FIG. 16, a contacting portion 94 (such as a protrusion, which is only exemplary) is arranged on the longitudinal wall 58 of the third rail 26 for being cooperated with the at least one auxiliary portion 92 of the operation member 70.

When the second rail 24 is desired to be displaced relative to the first rail 22 from the second extending position E2 to a retracting position (such as a fully retracting position) along the retracting direction D2, the third rail 26 can be reinserted into the second passage 55 of the second rail 24 (as shown in FIG. 15) from an outside of the second passage 55 of the second rail 24 (as shown in FIG. 14) . During the process, the third rail 26 is capable of contacting the auxiliary portion 92 of the operation member 70 through the contacting portion 94 to drive the operation member 70 to move relative to the second rail 24 from the second operation position P2 (as shown in FIG. 14 and FIG. 15) to the first operation position P1 (as shown in FIG. 16) , such that the second driving section 88 of the operation member 70 contacts the first guiding feature 48 of the positioning member 34 to drive the positioning member 34. That is, the positioning member 34 originally has a predetermined height h2 relative to the longitudinal wall 30 of the first rail 22 (as shown in FIG. 10) . The positioning member 34 is pushed by the second driving section 88 of the operation member 70, such that the predetermined height h2 is decreased or the positioning member 34 is pushed to abut against the longitudinal wall 30 of the first rail 22. As such, the positioning member 34 is no longer in the first predetermined state W1 (For example, the positioning member 34 is now in the second predetermined state W2 shown in FIG. 16) , and the positioning portion 46 of the positioning member 34 is no longer engaged with the predetermined feature 61, which allows the second rail 24 to displace from the second extending position E2 along the retracting direction D2, or allows the second rail 24 to displace from the second extending position E2 along the opening direction D1 . When the operation member 70 is moved from the second operation position P2 to the first operation position P1, the operation member 70 is moved relative to the second rail 24 along the retracting direction D2.

As shown in FIG. 17 and FIG. 18, when the second rail 24 is at the second extending position E2 relative to the first rail 22, the engagement relationship between the second rail 24 and the first rail 22 not only can be disengaged through the third rail 26 (as shown in FIG. 16) but also can be disengaged by the user directly operating the operation member 70. Specifically, through the operation member 70 being operably moved from the second operation position P2 to the first operation position P1, the positioning member 34 can be driven to leave the first predetermined state W1 (for example, the positioning member 34 is in the second predetermined state W2 as shown in FIG. 18), such that the positioning portion 46 of the positioning member 34 is no longer engaged with the predetermined feature 61 and the positioning member 34 is incapable of blocking the second rail 24 so as to allow the second rail 24 to displace from the second extending position E2 along the retracting direction D2 or to allow the second rail 24 to displace from the second extending position E2 along the opening direction D1.

Moreover, during the process that the second rail 24 is displaced from the retracting position (such as the fully retracing position) to the first extending position E1 along the opening direction D1, the extending portion 68 of the working member 60 is capable of moving along the guiding section 42 and the longitudinal section 44 of blocking member 32 of the first rail 22 so as to be guided to the blocking section 40 (which can refer to FIG. 2), such that the blocking section 40 of the blocking member 32 is capable of blocking the extending portion 68 of the working member 60 so as to prevent the second rail 24 to displace relative to the first rail 22 from the first extending position E1 along the retracting direction D2 (as shown in FIG. 6 and FIG. 7), which is well known in the art and is not described in detail for the sake of conciseness.

To sum up, the slide rail assembly according to the embodiment of the present invention includes the following features.

First, the blocking relationship between the second rail 24 and the first rail 22 is capable of being released through the operating member 70 operating the blocking member 32 or the positioning member 34, such that the second rail 24 is allowed to displace relative to the first rail 22 from an extending position (such as the first extending position E1 or the second extending position E2) along the retracting direction D2.

Second, when the second rail 24 is displaced relative to the first rail 22 from the first extending position E1 to the second extending position E2 along the retracting direction D2, the second rail 24 is engaged with the positioning member 34 through the predetermined feature 61 so as to prevent the second rail 24 from leaving the second extending position E2. With the operation member 70 being operably moved from an operation position to another operation position to drive the positioning member 34, the predetermined feature 61 is allowed to disengage from the positioning member 34 so as to allow the second rail 24 to displace from the second extending position E2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail comprising a blocking member and a positioning member, the blocking member comprising an elastic material;
a second rail capable of displacing relative to the first rail, the second rail comprising a predetermined feature;
a working member mounted to the second rail; and
an operation member for operating the blocking member;
wherein when the second rail is at a first extending position relative to the first rail, the blocking member is in a blocking state capable of blocking the working member so as to prevent the second rail from displacing from the first extending position along a retracting direction;
wherein the operation member is capable of being operated to move from a first operation position to a second operation position to drive the blocking member to leave the blocking state, such that the blocking member is incapable of blocking the working member so as to allow the second rail to displace from the first extending position along the retracting direction;
wherein when the second rail is displaced relative to the first rail from the first extending position to a second extending position along the retracting direction, the second rail is engaged with the positioning member through the predetermined feature so as to prevent the second rail from leaving the second extending position.

2. The slide rail assembly of claim 1, further comprising:
a third rail, wherein the second rail is movably mounted between the first rail and the third rail.

3. The slide rail assembly of claim 2, wherein the positioning member comprises an elastic material.

4. The slide rail assembly of claim 3, wherein:
the positioning member comprises a positioning portion;
during a process that the second rail is displaced from the first extending position to the second extending position along the retracting direction, the second rail drives the positioning member to move from a first predetermined state to a second predetermined state through the predetermined feature, such that the positioning member accumulates an elastic force;
when the second rail reaches the second extending position, the positioning member returns from the second predetermined state to the first predetermined state in response to the release of the elastic force, such that the positioning member is engaged with the predetermined feature through the positioning portion so as to prevent the second rail from leaving the second extending position.

5. The slide rail assembly of claim 4, wherein when the second rail is at the first extending position relative to the first rail, the slide rail assembly has a first length; when the second rail is at the second extending position relative to the first rail, the slide rail assembly has a second length less than the first length.

6. The slide rail assembly of claim 4, wherein when the second rail is at the second extending position, the third rail is capable of being displaced relative to the second rail along an opening direction so as to be detached from a passage of the second rail.

7. The slide rail assembly of claim 6, wherein the operation member is operably mounted to the second rail.

8. The slide rail assembly of claim 7, wherein when the third rail is reinserted into the passage of the second rail from an outside of the passage of the second rail along the retracting direction, the third rail drives the operation member to move relative to the second rail from the second operation position to the first operation position to drive the positioning member to leave the first predetermined state, such that the positioning portion of the positioning member is no longer engaged with the predetermined feature so as to allow the second rail to displace from the second extending position along the retracting direction.

9. The slide rail assembly of claim 4, wherein the positioning member is driven to leave the first predetermined state through the operation member being operably moved from the second operation position to the first operation position, such that the positioning portion of the positioning member is no longer engaged with the predetermined feature so as to allow the second rail to displace from the second extending position along the retracting direction.

10. The slide rail assembly of claim 1, wherein the working member is movably mounted to the second rail, and the slide rail assembly further comprises an elastic member for providing an elastic force to the working member.

11. A slide rail assembly, comprising:
a first rail comprising a blocking member and a positioning member;
a second rail capable of displacing relative to the first rail; and
an operation member;
wherein when the second rail is at a first extending position relative to the first rail, the blocking member is for blocking the second rail so as to prevent the second rail from displacing from the first extending position along a retracting direction;
wherein the blocking member is driven through the operation member being operably moved from a first operation position to a second operation position, such that the blocking member is incapable of blocking the second rail so as to allow the second rail to displace from the first extending position along the retracting direction;
wherein when the second rail is displaced relative to the first rail from the first extending position to a second extending position along the retracting direction, the positioning member is for blocking the second rail so as to prevent the second rail from leaving the second extending position;
wherein the positioning member is driven through the operation member being operably moved from the second operation position to the first operation position, such that the positioning member is incapable of blocking the second rail so as to allow the second rail to leave the second extending position.

12. The slide rail assembly of claim 11, further comprising:
a working member mounted to the second rail, wherein when the second rail is at the first extending position relative to the first rail, the blocking member is in a blocking state capable of blocking the working member so as to prevent the second rail from displacing from the first extending position along the retracting direction.

13. The slide rail assembly of claim 12, wherein the second rail comprises a predetermined feature, when the second rail is displaced relative to the first rail from the first extending position to the second extending position along the retracting direction, the second rail is engaged with the positioning member through the predetermined feature so as to prevent the second rail from leaving the second extending position.

14. The slide rail assembly of claim 13, further comprising:
a third rail, wherein the second rail is movably mounted between the first rail and the third rail.

15. The slide rail assembly of claim 14, wherein when the second rail is at the second extending position, the third rail is capable of being displaced relative to the second rail along an opening direction so as to be detached from a passage of the second rail.

16. The slide rail assembly of claim 15, wherein when the third rail is reinserted into the passage of the second rail from an outside of the passage of the second rail along the retracting direction, the third rail drives the operation member to move relative to the second rail from the second operation position to the first operation position to drive the positioning member, such that the positioning member is no longer engaged with the predetermined feature so as to allow the second rail to displace from the second extending position along the retracting direction.

17. The slide rail assembly of claim 12, wherein the working member is movably mounted to the second rail, and the slide rail assembly further comprises an elastic member for providing an elastic force to the working member.

18. The slide rail assembly of claim 11, wherein at least one of the blocking member and the positioning member comprises an elastic material.

19. A slide rail assembly, comprising:
a first rail comprising a positioning member;
a second rail capable of displacing relative to the first rail, the second rail comprising a predetermined feature; and
an operation member;
wherein when the second rail is displaced relative to the first rail from a first extending position to a second extending position along a retracting direction, the second rail is engaged with the positioning member through the predetermined feature so as to prevent the second rail from leaving the second extending position;
wherein the positioning member is driven through the operation member being operably moved from an operation position to another operation position, such that the predetermined feature is no longer engaged with the positioning member so as to allow the second rail to leave the second extending position.

20. The slide rail assembly of claim 19, wherein the positioning member comprises an elastic material, the slide rail assembly further comprises a third rail, the second rail is movably mounted between the first rail and the third rail, when the second rail is at the first extending position relative to the first rail, the slide rail assembly has a first length, when the second rail is at the second extending position relative to the first rail, the slide rail assembly has a second length less than the first length.

\* \* \* \* \*